(12) United States Patent
Kwok

(10) Patent No.: US 6,211,037 B1
(45) Date of Patent: Apr. 3, 2001

(54) LOCOS PROCESSES

(75) Inventor: Siang Ping Kwok, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/387,661

(22) Filed: Aug. 30, 1999

(51) Int. Cl.$^7$ .................................................. H01L 21/76
(52) U.S. Cl. ............................................ 438/400; 438/400
(58) Field of Search .................................. 438/400, 410, 438/423, 425, 431, 439, 440, 407, 424, 426, 427, 441

(56) References Cited

U.S. PATENT DOCUMENTS 4,752,591 * 6/1988 Beitman ............................ 438/439
5,882,984 * 3/1999 Fan et al. .......................... 438/440
5,902,128 * 5/1999 Mathews et al. ................. 438/440

\* cited by examiner

*Primary Examiner*—David Nelms
*Assistant Examiner*—David Nhu
(74) *Attorney, Agent, or Firm*—Wells, St. John, Roberts, Gregory & Matkin, P.S.

(57) ABSTRACT

The invention includes a method of reducing stress during formation of field oxide by LOCOS. Field oxide is formed by oxidizing a silicon substrate, and fluorine is incorporated into the field oxide during the oxidizing. After the fluorine is incorporated into the field oxide, the field oxide is annealed at a temperature of at least about 1000° C.

21 Claims, 4 Drawing Sheets

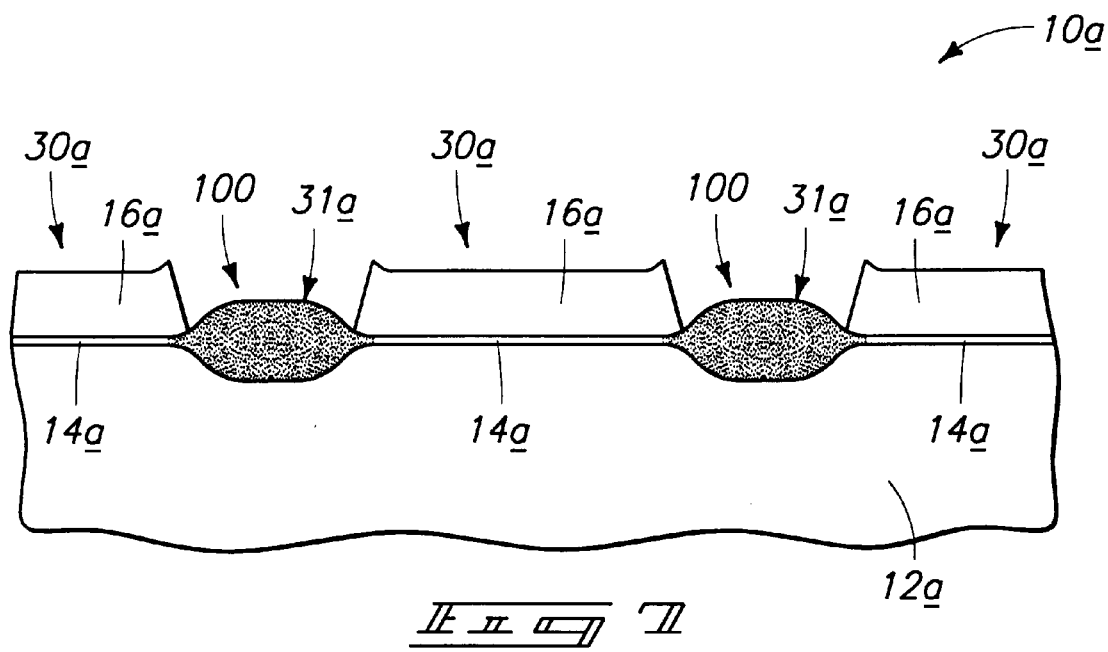
_Fig. 7_
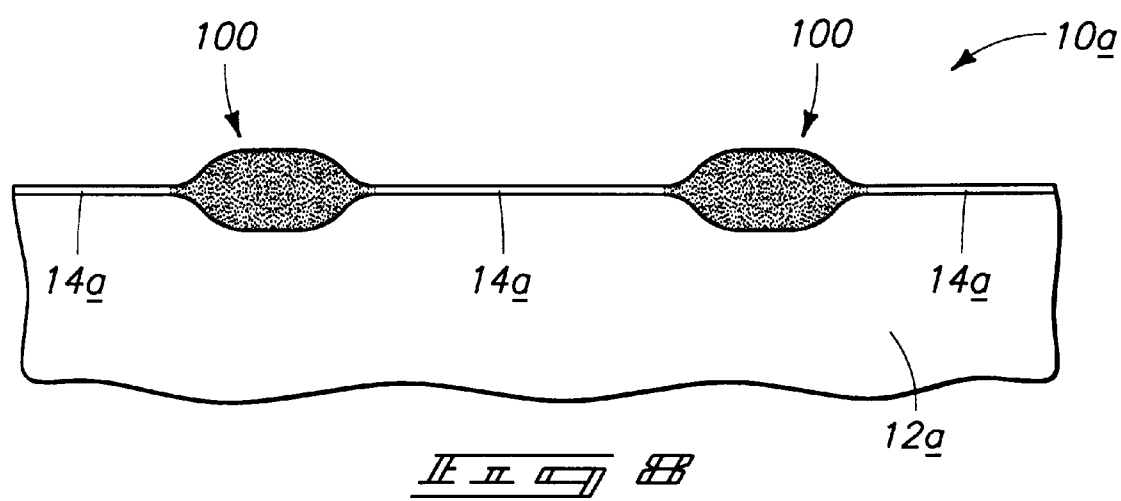
_Fig. 8_

LOCOS PROCESSES

TECHNICAL FIELD

The invention pertains to LOCOS processes, and in particular aspects pertains to methods of reducing stress during formation of field oxide by LOCOS.

BACKGROUND OF THE INVENTION

Local oxidation of silicon (LOCOS) is a method of forming field oxide regions for integrated circuitry on semiconductive material wafers. The field oxide regions can be utilized to electrically separate adjacent electrical devices. A LOCOS process is described with reference to FIGS. 1–4.

Referring to FIG. 1, a semiconductive material wafer fragment 10 is illustrated at a preliminary step of the LOCOS process. Wafer fragment 10 comprises a semiconductive material wafer substrate 12, having a pad oxide layer 14 and a silicon nitride layer 16 formed thereover. Pad oxide layer 14 can comprise, for example, silicon dioxide. Pad oxide layer 14 is typically formed to a thickness of from about 20 nanometers to about 60 nanometers, and silicon nitride layer 16 is typically formed to a thickness of from about 100 nanometers to about 200 nanometers. Substrate 12 can comprise, for example, lightly doped monocrystalline silicon. To aid in interpretation of the claims that follow, the term "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A patterned masking layer 18 is provided over silicon nitride layer 16. Patterned masking layer 18 can comprise, for example, photoresist patterned by a photolithographic process. Patterned masking layer 18 covers some portions (labeled as 20) of silicon nitride layer 16, and leaves other portions (labeled as 22) uncovered.

Referring to FIG. 2, wafer fragment 10 is subjected to etching conditions which remove uncovered portions 22 of silicon nitride material 16 to form openings 26. The etching also extends through pad oxide layer 14 to expose portions 31 of a surface of silicon layer 12. The etching can either stop at an upper surface of substrate 12 (as shown), or in other processing (not shown) can extend partially into substrate 12. The etching of openings 26 forms covered portions 20 of pad oxide 14 and silicon nitride 16 into masking blocks 30.

Referring to FIG. 3, masking layer 18 (FIG. 2) is removed and wafer fragment 10 is subjected to oxidizing conditions which oxidize the semiconductive material of substrate 12 to grow silicon dioxide between masking blocks 30 and thereby form field oxide regions 50. The oxidizing conditions can comprise, for example, wet oxidation conducted at temperatures of about 1,000° C. for a time of from about two hours to about four hours.

Referring to FIG. 4, nitride layer 16 (FIG. 3) is removed to leave field oxide regions 50 over substrate 12. Field oxide regions 50 are joined by pad oxide 14 extending therebetween. In subsequent processing (not shown), pad oxide 14 can be stripped and replaced with another oxide layer. In further subsequent processing, semiconductor devices, such as, for example, transistors, can be formed between field oxide regions 50. Such devices will then be electrically isolated between regions by field oxide regions 50.

A difficulty which can occur during the above-discussed LOCOS processing is that the nitride material 16 of masking blocks 30 can cause tensile stress relative to underlying silicon-containing layers, which can result in deformation and dislocation of field oxide regions 50. The problems associated with nitride-induced tensile stress increase as the spacing between masking blocks 30 is decreased. A continuing goal in semiconductor processing is to reduce spacings between adjacent devices. Accordingly, it would be desirable to alleviate the nitride-induced tensile stress associated with LOCOS processing.

SUMMARY OF THE INVENTION

In one aspect, the invention includes a method of reducing stress during formation of field oxide by LOCOS. Field oxide is formed by oxidizing a silicon-comprising substrate, and fluorine is incorporated into the field oxide during the oxidizing.

In another aspect, the invention includes a method of forming field oxide by LOCOS. A patterned silicon nitride layer is provided over a monocrystalline silicon substrate. The patterned silicon nitride layer covers some portions of the silicon-comprising substrate while leaving other portions uncovered. The uncovered portions of the substrate are exposed to an atmosphere comprising oxygen and fluorine to form field oxide regions having fluorine incorporated therein.

In yet another aspect, the invention includes a LOCOS process. A pad oxide is provided over a silicon-comprising substrate. A silicon nitride layer is provided over the pad oxide layer. The silicon nitride layer and pad oxide layer are patterned to form masking blocks, and to expose portions of the silicon-comprising substrate between the masking blocks. The exposed portions of the silicon-comprising substrate are defined as field oxide locations. The silicon-comprising substrate is oxidized in the field oxide locations to form field oxide regions. The silicon-comprising substrate is exposed to fluorine as it is oxidized to incorporate fluorine within the field oxide regions. After incorporating the fluorine, the field oxide regions are annealed at a temperature of at least about 1,000° C.

BRIEF DESCRIPTION OF THE DRAWINGS

Preferred embodiments of the invention are described below with reference to the following accompanying drawings.

FIG. 7 is a view of the FIG. 5 wafer fragment shown at a processing step subsequent to that of FIG. 6.

FIG. 8 is a view of the FIG. 5 wafer fragment shown at a processing step subsequent to that of FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A LOCOS process of the present invention is described with reference to FIGS. 5–8. In referring to FIGS. 5–8, similar numbering will be used as was utilized above in describing the prior art, with either the suffix "a" or different numerals utilized to differentiate structures shown in FIGS. 5–8 from those shown in FIGS. 1–4.

Figure 1:
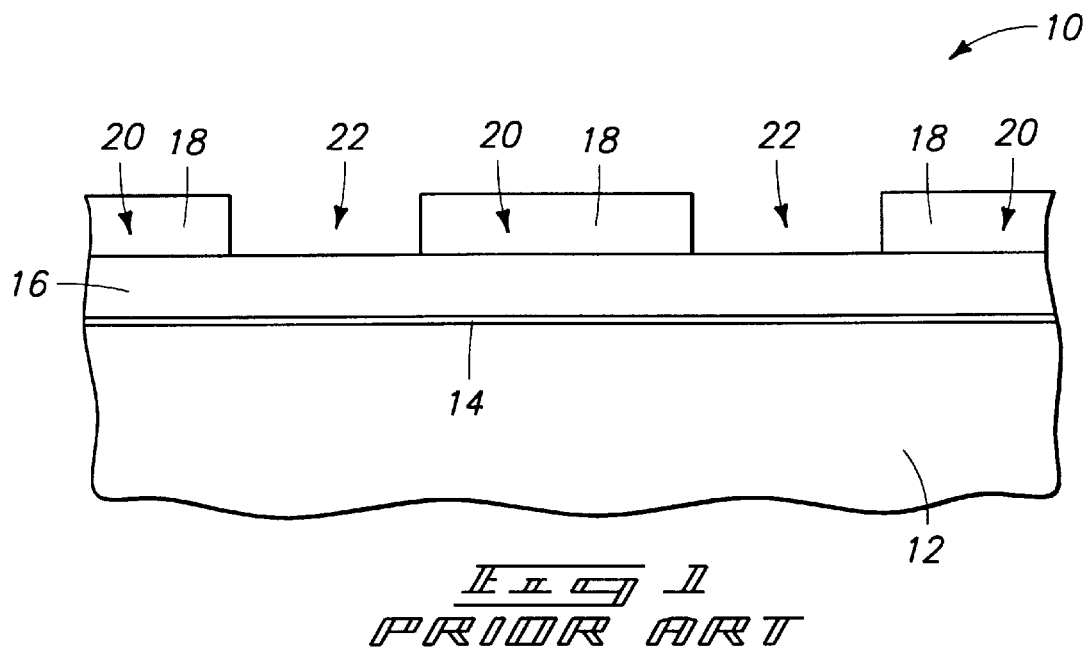
FIG. 1 is a diagrammatic, cross-sectional view of a semiconductive material wafer fragment at a preliminary processing step of a prior art LOCOS process.
Figure 2:
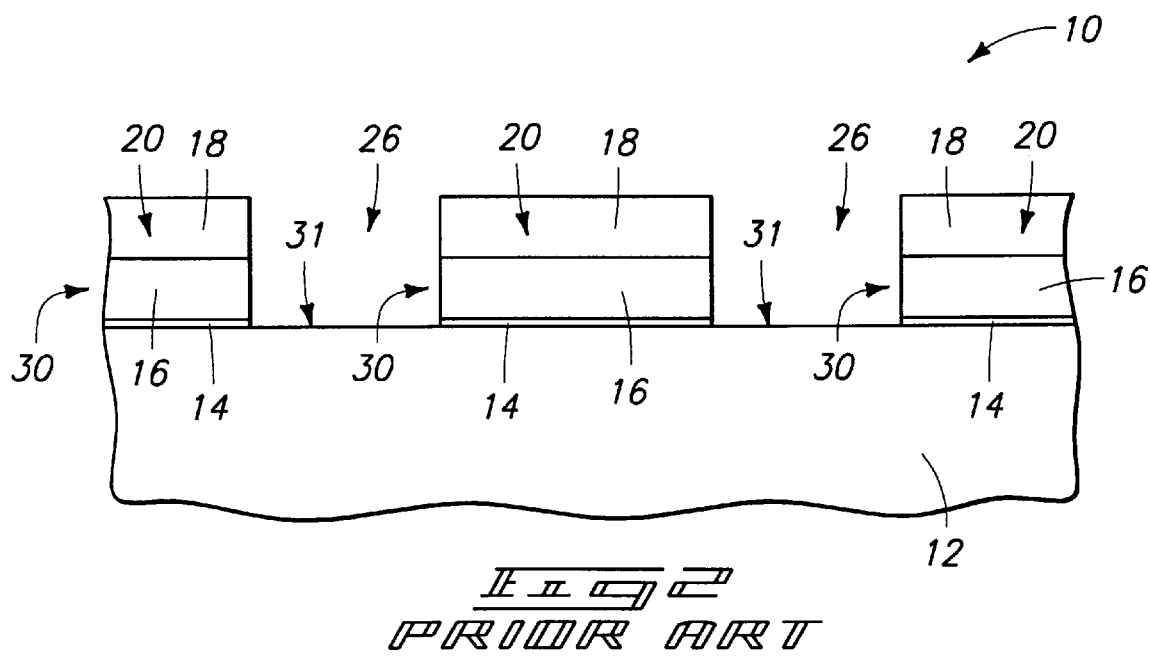
FIG. 2 is a view of the FIG. 1 wafer fragment shown at a prior art processing subsequent to that of FIG. 1.
Figure 3:
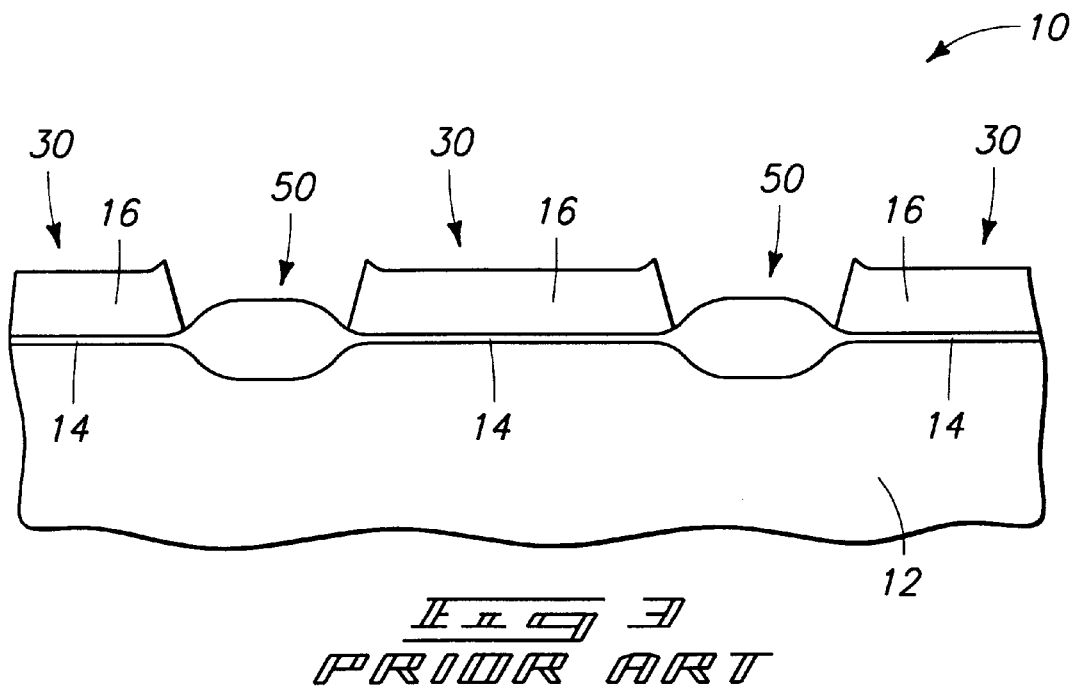
FIG. 3 is a view of the FIG. 1 wafer fragment shown at a prior art processing step subsequent to that of FIG. 2.
Figure 4:
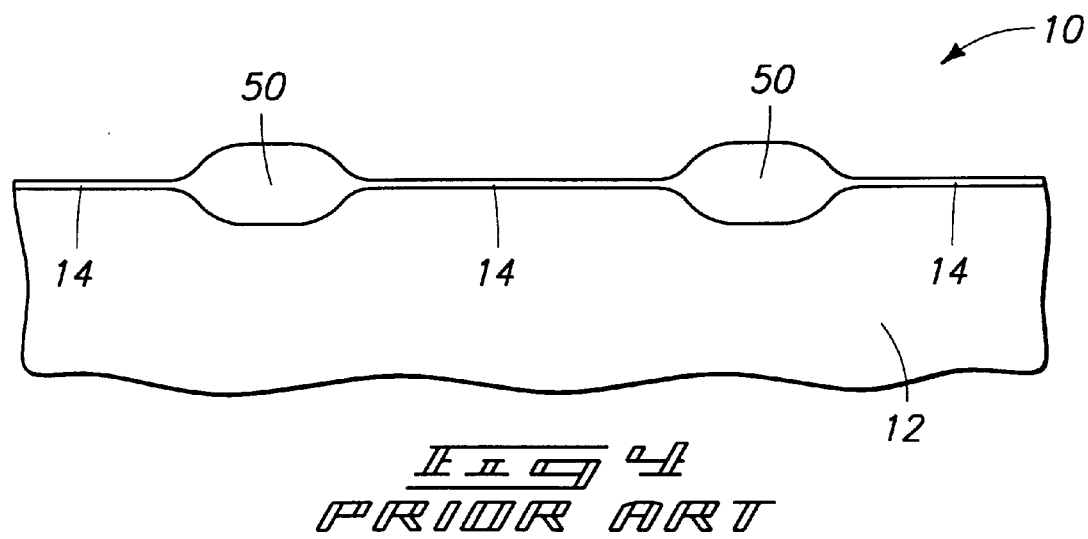
FIG. 4 is a view of the FIG. 1 wafer fragment shown at a prior art processing step subsequent to that of FIG. 3.
Figure 5:
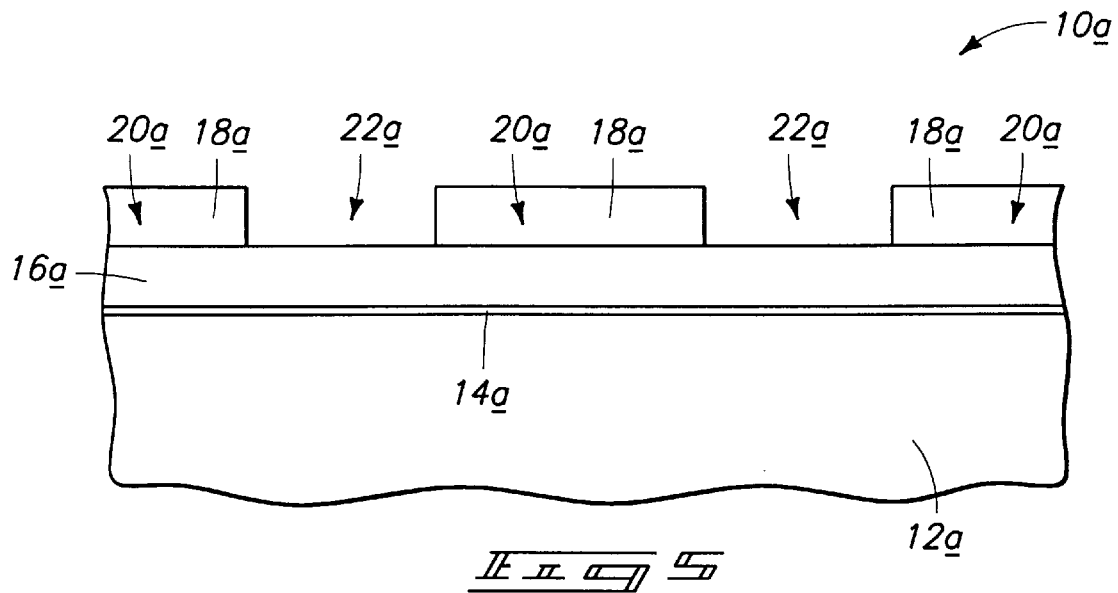
FIG. 5 is a diagrammatic, cross-sectional view of a semiconductive material wafer fragment at a preliminary step of a LOCOS process encompassed by the present invention.

Referring to FIG. 5, a semiconductive material wafer fragment 10a is shown at a preliminary step of a LOCOS process. Wafer fragment 10a comprises a substrate 12a, a pad oxide layer 14a, a silicon nitride layer 16a, and a patterned masking material 18a. Substrate 12a, pad oxide layer 14a, silicon nitride layer 16a, and masking material layer 18a can comprise constructions and materials identical to those discussed above regarding substrate 12, pad oxide 14, silicon nitride 16 and masking material 18 respectively, of the prior art. Alternate materials could, of course, be used. Fewer or more layers could be used.

Figure 6:
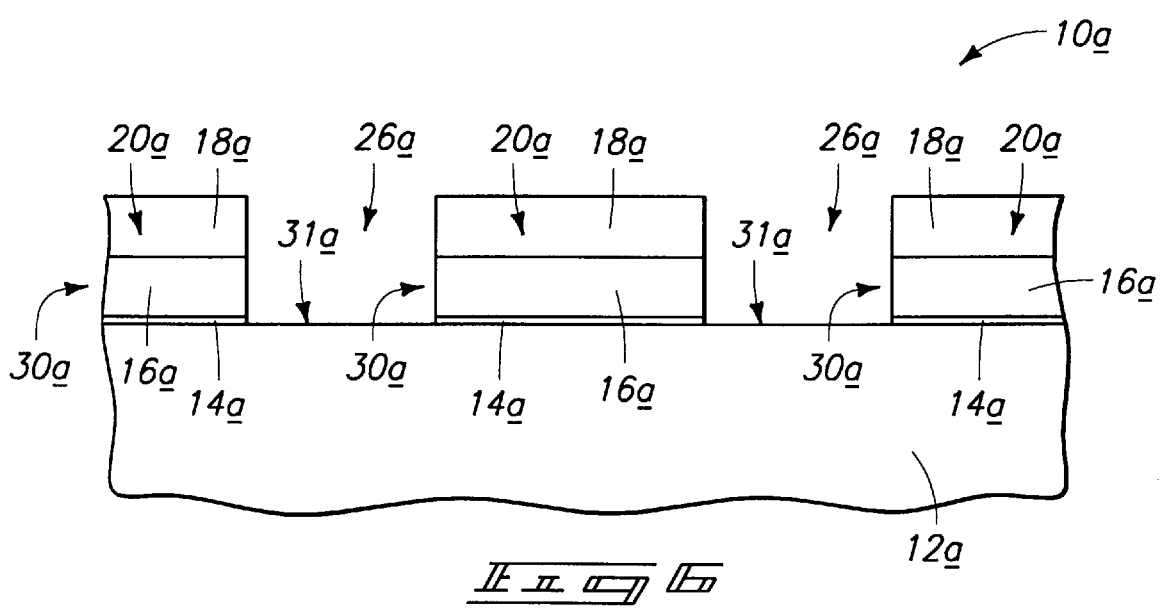
FIG. 6 is a view of the FIG. 5 wafer fragment shown at a processing step Subsequent to that of FIG. 5.

Referring to FIG. 6, wafer fragment 10a is subjected to etching conditions which etch openings 26a into layers 14a and 16a, and which accordingly pattern remaining portions of layers 14a and 16a into masking blocks 30a. The etching also exposes portions 31a of substrate 12a between masking blocks 30a. The exposed portions 31a define field oxide locations.

Referring to FIG. 7, masking material 18a (FIG. 6) is removed and wafer fragment 10a is exposed to oxidizing conditions and fluorine. Such exposure forms field oxide regions 100 at locations 31. The field oxide regions have fluorine incorporated therein (the fluorine is illustrated as stippling within field oxide regions 100). An exemplary process for incorporating fluorine into the field oxide regions is to form the field oxide regions by exposing wafer fragment 10a to an atmosphere comprising $O_2$ and $NF_3$ during the oxidation of substrate 12a. Exemplary oxidation conditions include maintaining the exposed portions of substrate 12a at a temperature of at least about 1,100° C. during the oxidation, and exposing the substrate to $O_2$ and $NF_3$ for a time of at least about 1.5 hours. The exposure preferably occurs within a reactor, with a pressure within the reactor being maintained to at least about 1 atmosphere. In an exemplary application, the pressure can be maintained to at least about 25 atmospheres. The atmosphere to which wafer fragment 10a is exposed preferably consists essentially of $O_2$ and $NF_3$, with the $NF_3$ being provided to a concentration of from greater than 0 ppm to about 200 ppm, and preferably to about 100 ppm.

Referring to FIG. 8, silicon nitride material 16a (FIG. 7) is removed, and field oxide regions 100 remain over substrate 12a. Field oxide regions 100 can then preferably be subjected to an anneal to diffuse excess fluorine out of the field oxide regions. Preferably, the anneal is conducted at a temperature of equal to or greater than any temperature to which field oxide regions 100 would be expected to be subjected to during subsequent device formation over substrate 12a. Exemplary anneal conditions comprise exposure of regions 100 to a temperature that is at least about 1,000° C. for a time of at least about 2 hours, and while field oxide regions 100 are exposed to an inert atmosphere, such as, for example, an $N_2$ atmosphere. The term "inert" is defined to mean an atmosphere which is substantially non-reactive with exposed portions of regions 100.

The exposure of field oxide regions 100 to the anneal preferably removes fluorine that could otherwise possibly out-diffuse from field oxide regions 100 during subsequent thermal processing of substrate 12a. Such can advantageously alleviate out-diffusion of fluorine from field oxide regions 100 into devices (not shown) subsequently formed proximate field oxide regions 100. The annealing of field oxide regions 100 can occur before removal of silicon nitride 16a (FIG. 7) from over substrate 12a, or subsequent to such removal.

In subsequent processing (not shown), pad oxide 14 can be stripped and replaced with another oxide layer. In further subsequent processing, circuit devices, such as, for example, transistors, can be formed between field oxide regions 100. Such devices will then be electrically separated from one another by field oxide regions 100. The annealing described above for out-diffusing of fluorine from field oxide regions 100 can occur before or after stripping of pad oxide 14a.

The fluorine provided within field oxide regions 100 by methods of the present invention can alleviate tensile stress of silicon nitride material 16a relative to underlying and proximate structures. Specifically, it has been found that tensile stress can be reduced by a factor of from 5 to 10 by a process of the present invention relative to prior art LOCOS processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of reducing stress during formation of field oxide by LOCOS, comprising:
    forming the field oxide by oxidizing a silicon-comprising substrate;
    incorporating fluorine into the field oxide during the oxidizing; and
    after incorporating the fluorine, and in a separate step from the incorporation of the fluorine, annealing the field oxide at a temperature of at least about 1000° C.

2. The method of claim 1 wherein the annealing is conducted for a time of at least about 2 hours and while the substrate is exposed to an $N_2$ atmosphere.

3. The method of claim 2 wherein the oxidizing and exposing to fluorine comprise exposing the substrate to an atmosphere comprising $O_2$ and $NF_3$.

4. The method of claim 2 wherein the oxidizing and exposing to fluorine comprise exposing the substrate to an atmosphere comprising $O_2$ and $NF_3$, for a time of at least about 1.5 hours, and at a temperature of at least about 1100° C.

5. The method of claim 4 wherein the $NF_3$ is present to a concentration of from greater than 0 ppm to about 200 ppm in the $O_2$.

6. The method of claim 4 wherein the substrate is exposed to a pressure of at least about 1 atmosphere during the oxidizing and exposing.

7. The method of claim 4 wherein the substrate is exposed to a pressure of at least about 25 atmospheres during the oxidizing and exposing.

8. A method of forming field oxide by LOCOS, comprising:
   providing a patterned silicon nitride layer over a monocrystalline silicon substrate, the patterned silicon nitride layer covering some portions of the substrate while leaving other portions uncovered;
   exposing the uncovered portions of the substrate to an atmosphere comprising oxygen and fluorine to form field oxide regions having fluorine incorporated therein; and
   after incorporating the fluorine, and in a separate step from the incorporation of the fluorine, annealing the field oxide at a temperature of at least about 1000° C.

9. The method of claim 8 wherein the annealing is conducted for a time of about 2 hours and while the substrate is exposed to an $N_2$ atmosphere.

10. The method of claim 9 wherein the oxidizing and exposing to fluorine comprise exposing the substrate to an atmosphere comprising $O_2$ and $NF_3$.

11. The method of claim 9 wherein the oxidizing and exposing to fluorine comprise exposing the substrate to an atmosphere comprising $O_2$ and $NF_3$, for a time of at least about 1.5 hours, and at a temperature of at least about 1100° C.

12. The method of claim 11 wherein the $NF_3$ is present to a concentration of from greater than 0 ppm to about 200 ppm in the $O_2$.

13. The method of claim 11 wherein the substrate is exposed to a pressure of at least about 1 atmosphere during the oxidizing and exposing.

14. The method of claim 11 wherein the substrate is exposed to a pressure of at least about 25 atmospheres during the oxidizing and exposing.

15. A LOCOS process, comprising:
   providing a pad oxide layer over a silicon-comprising substrate;
   providing a silicon nitride layer over the pad oxide layer;
   patterning the silicon nitride layer and pad oxide layer to form masking blocks of the silicon nitride layer and pad oxide layer, and to expose portions of the silicon-comprising substrate between the masking blocks, the exposed portions of the silicon-comprising substrate being defined as field oxide locations;
   oxidizing the silicon-comprising substrate in the field oxide locations to form field oxide regions;
   while oxidizing the silicon-comprising substrate, exposing the silicon-comprising substrate to fluorine to incorporate fluorine in the field oxide regions;
   after incorporating the fluorine, and in a separate step from the incorporation of the fluorine, annealing the field oxide regions at a temperature of at least about 1000° C., the annealing occurring prior to forming devices proximate the field oxide regions.

16. The process of claim 15 wherein the annealing is conducted for a time of at least about 2 hours and while the substrate is exposed to an $N_2$ atmosphere.

17. The process of claim 15 further comprising, after forming the field oxide region, removing the masking blocks from over the silicon-comprising substrate.

18. The process of claim 15 wherein the oxidizing and exposing to fluorine comprise exposing the substrate to an atmosphere comprising $O_2$ and $NF_3$.

19. The process of claim 15 wherein the oxidizing and exposing to fluorine comprise exposing the substrate to an atmosphere comprising $O_2$ and $NF_3$, for a time of at least about 1.5 hours, and at a temperature of at least about 1100° C.

20. The process of claim 19 wherein the substrate is exposed to a pressure of at least about 1 atmosphere during the oxidizing and exposing.

21. The process of claim 19 wherein the substrate is exposed to a pressure of at least about 25 atmospheres during the oxidizing and exposing.

* * * * *

UNITED STATES PATENT AND TRADEMARK OFFICE
CERTIFICATE OF CORRECTION

PATENT NO. : 6,211,037 B1
DATED : April 3, 2001
INVENTOR(S) : Siang Ping Kwok

Page 1 of 1

It is certified that error appears in the above-identified patent and that said Letters Patent is hereby corrected as shown below:

Column 2,
Line 54, insert -- step -- after the word "processing".
Line 65, replace "Subsequent" with -- subsequent --.

Signed and Sealed this

Eighteenth Day of December, 2001

Attest:

JAMES E. ROGAN
Attesting Officer
Director of the United States Patent and Trademark Office